US012130241B2

(12) United States Patent
Leng

(10) Patent No.: US 12,130,241 B2
(45) Date of Patent: Oct. 29, 2024

(54) MONITORING COPPER CORROSION IN AN INTEGRATED CIRCUIT DEVICE

(71) Applicant: Microchip Technology Incorporated, Chandler, AZ (US)

(72) Inventor: Yaojian Leng, Portland, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 66 days.

(21) Appl. No.: 18/093,032

(22) Filed: Jan. 4, 2023

(65) Prior Publication Data

US 2023/0160836 A1 May 25, 2023

Related U.S. Application Data

(62) Division of application No. 16/683,987, filed on Nov. 14, 2019, now Pat. No. 11,573,189.

(Continued)

(51) Int. Cl.
*G01N 21/95* (2006.01)
*G01N 17/02* (2006.01)
(Continued)

(52) U.S. Cl.
CPC ......... *G01N 21/9501* (2013.01); *G01N 17/02* (2013.01); *G01N 21/47* (2013.01);
(Continued)

(58) Field of Classification Search
CPC ......... G01N 17/006; G01N 2021/4735; G01N 21/47; G01N 21/8851; G01N 21/9501;
(Continued)

(56) References Cited

U.S. PATENT DOCUMENTS

| 6,278,129 B1 * | 8/2001 | Sugasawara | H01L 22/34 257/620 |
| 2003/0221966 A1 | 12/2003 | Bonkass et al. | 205/103 |

(Continued)

FOREIGN PATENT DOCUMENTS

| CN | 103545294 A | 1/2014 | H01L 21/66 |
| JP | 11195685 A | 7/1999 | H01L 21/66 |

(Continued)

OTHER PUBLICATIONS

Song, Zhigang et al., "Copper Corrosion Issue and Analysis on Copper Damascene Process," IEEE Transactions on Device and Materials Reliability, vol. 5, No. 2, pp. 206-211, Jun. 1, 2005.

(Continued)

*Primary Examiner* — Tri T Ton
(74) *Attorney, Agent, or Firm* — SLAYDEN GRUBERT BEARD PLLC

(57) ABSTRACT

Systems and methods for monitoring copper corrosion in an integrated circuit (IC) device are disclosed. A corrosion-sensitive structure formed in the IC device may include a p-type active region adjacent an n-type active region to define a p-n junction space charge region. A copper region formed over the silicon may be connected to both the p-region and n-region by respective contacts, to thereby define a short circuit. Light incident on the p-n junction space charge region, e.g., during a CMP process, creates a current flow through the metal region via the short circuit, which drives chemical reactions that cause corrosion in the copper region. Due to the short circuit configuration, the copper region is highly sensitive to corrosion. The corrosion-sensitive structure may be arranged with less corrosion-sensitive copper structures in the IC device, with the corrosion-sensitive structure used as a proxy to monitor for copper corrosion in the IC device.

17 Claims, 8 Drawing Sheets

Related U.S. Application Data

(60) Provisional application No. 62/791,046, filed on Jan. 11, 2019.

(51) Int. Cl.

| | |
|---|---|
| *G01N 21/47* | (2006.01) |
| *G01N 21/88* | (2006.01) |
| *H01L 21/66* | (2006.01) |
| *H01L 23/522* | (2006.01) |
| *H01L 23/528* | (2006.01) |
| *H01L 23/532* | (2006.01) |
| *H01L 31/02* | (2006.01) |
| *H01L 31/103* | (2006.01) |

(52) U.S. Cl.
CPC ......... *G01N 21/8851* (2013.01); *H01L 22/14* (2013.01); *H01L 23/5226* (2013.01); *H01L 23/528* (2013.01); *H01L 23/53238* (2013.01); *H01L 31/02005* (2013.01); *H01L 31/103* (2013.01); *G01N 2021/4735* (2013.01); *G01N 2201/06113* (2013.01)

(58) Field of Classification Search
CPC ... G01N 21/95684; G01N 2201/06113; G01N 17/02; H01L 21/7684; H01L 21/76883; H01L 22/12; H01L 22/14; H01L 22/24; H01L 22/34; H01L 23/5226; H01L 23/528; H01L 23/53238; H01L 31/02005; H01L 31/103; H04W 24/10; H04W 28/0263; H04W 28/0268; H04W 28/10; H04W 36/0069; H04W 40/22; H04W 40/24; H04W 76/12; H04W 76/15; H04W 76/18; H04W 84/047; H04W 92/20; Y02D 30/70
See application file for complete search history.

(56) References Cited

U.S. PATENT DOCUMENTS

| | | | |
|---|---|---|---|
| 2004/0152298 A1* | 8/2004 | Ohashi | H01L 21/02074 257/E21.582 |
| 2005/0194689 A1 | 9/2005 | Chapple-sokol et al. | 257/762 |
| 2007/0044710 A1* | 3/2007 | Buschbeck | H01L 22/12 117/53 |
| 2009/0029490 A1 | 1/2009 | Baiocchi et al. | 438/14 |
| 2017/0316991 A1 | 11/2017 | Beckmeier et al. | |

FOREIGN PATENT DOCUMENTS

| | | | |
|---|---|---|---|
| JP | 11195985 A | 7/1999 | H03L 7/18 |
| JP | 11297700 A | 10/1999 | H01L 21/304 |
| JP | 2000012638 A | 1/2000 | H01L 21/304 |

OTHER PUBLICATIONS

Gale, Glenn W. et al., "Chapter 5: Surface Preparation," *Handbook of Semiconductor Manufacturing Technology*, $2^{nd}$ edition, 36 pages, 2008.

International Search Report and Written Opinion, Application No. PCT/US2020/013006, 14 pages, May 12, 2020.

Chinese Office Action, Application No. 202080008465.5, 32 pages, Jul. 29, 2023.

Chinese Rejection Decision, Application No. 202080008465.5, 41 pages, May 26, 2024.

\* cited by examiner

MONITORING COPPER CORROSION IN AN INTEGRATED CIRCUIT DEVICE

RELATED APPLICATIONS

This application is a divisional of U.S. application Ser. No. 16/683,987 filed Nov. 14, 2019, which claims priority to U.S. Provisional Application No. 62/791,046, filed Jan. 11, 2019, which applications are hereby incorporated in their entirety.

TECHNICAL FIELD

The present disclosure relates to integrated circuit devices and structures, and more particularly to systems and methods for monitoring copper corrosion in an integrated circuit device.

BACKGROUND

In the context of integrated circuit (IC) manufacturing, copper interconnects have generally replaced aluminum interconnects. In general, copper interconnects (a) have a lower resistivity (about 35% less) than aluminum, (b) have a higher electromigration resistance (typically 2-4 orders of magnitude better than aluminum), (c) are compatible with low k dielectric material, and (d) provide a better yield and reliability than aluminum.

On the other hand, unlike aluminum, exposed copper does not form an effective native oxide ($CuO_2$ is relatively porous, allowing oxygen penetration). Thus, copper is generally more susceptible to corrosion than aluminum, particularly during and immediately after a Cu CMP (chemical mechanical planarization) process. Copper corrosion can have a significant impact on IC device yield and reliability.

The standard industry practice for detecting copper corrosion in IC manufacturing is utilization of defect inspection tools, such as (a) laser scattering based inspection or (b) brute force pattern recognition by comparison of digitized images, to detect copper corrosion after a copper CMP process or after deposition of a dielectric barrier (e.g., SiN or SiC), for example. However, with these conventional corrosion detection approaches, the detection sensitivity typically varies significantly from device to device, making it difficult to establish a stable baseline and detect process variations. In addition, copper corrosion may be enhanced when exposed to a light source by the process of light-induced copper redeposition, and the corrosion is often highly dependent on the relevant circuit or structure.

Thus, there is a need for effectively monitoring copper corrosion in IC structures, for both (a) in-line defect monitoring during IC manufacturing and (b) end-of-line reliability assessment. There is also a need for a corrosion monitoring system that can be located in a scribe-line, independent of the particular IC structure or device, and highly-sensitive to the relevant corrosion.

FIGS. 1 and FIGS. 2A-2B illustrate copper corrosion mechanisms that occur in two common IC structures. FIG. 1 is a cross-sectional side view of an example of a common copper structure 100 in an IC device that is susceptible to corrosion. Structure 100 includes a copper region 102 enclosed by a barrier layer 104 on four sides and bottom, e.g., a tantalum (Ta) layer or tantalum nitride (TaN) layer, or tantalum (Ta)/tantalum nitride (TaN) bi-layer. Copper region 102 may be susceptible to corrosion, including oxidation at the exposed upper surface 106 of copper region 102 and/or electrochemical corrosion due to an electro-chemical potential difference between copper 102 and barrier layer 104 (e.g., Ta or TaN).

FIGS. 2A and 2B show an example of another common copper structure 200 in an IC device that is susceptible to corrosion. FIGS. 2A and 2B are based on images in the Handbook of Semiconductor Manufacturing Technology, 2ed (2008), by Yoshio Nishi & Robert Doering, Chapter 5: Surface Preparation, at pp. 5-25. FIG. 2A is a cross-sectional side view of structure 200 which includes an adjacent pair of copper regions 202A and 202B, with copper region 202A connected to a p-doped active region 204A by a first conductive contact 206A and copper region 202B connected to an n-doped active region 204B by a second conductive contact 206B. In addition to oxidation at the exposed surfaces of copper regions 202A and 202B, copper regions 202A and 202B may be susceptible to corrosion from photo-induced copper re-deposition, e.g., during Cu CMP process, or during Cu CMP clean process, or right after Cu CMP process, in which the top surface of structure 200 is exposed to slurry or liquid or ambient moisture. Photo-induced copper re-deposition may result from light incident on the p-n junction "space charge region" 210, which creates a voltage difference between copper regions 202A and 202B due to the photo-voltaic effect (similar to a solar cell), and drives a flow of copper ions between copper regions 202A and 202B. The depleted copper in copper region 202A may form "bat-cave vias" that extend into copper region 202A under a portion of the via. Further, copper redeposition onto copper region 202B may form on the side walls of the respective via that may cause copper intrusion into the interlayer dielectric (ILD).

FIG. 2B is a top view of structure 200, after corrosion of the copper regions 202A and 202B caused by photo-inducted copper re-deposition. As shown, copper regions 202B have a noticeably different appearance than copper regions 202A after the redeposition of Cu ions from copper regions 202A to copper regions 202B. As discussed above, this corrosion may be detected using defect inspection tools, such as laser scattering based inspection or comparison of digitized images for brute force pattern recognition.

SUMMARY

Systems and methods for monitoring copper corrosion in an integrated circuit (IC) device are provided. A corrosion-sensitive structure formed in the IC device may include a p-type silicon region adjacent an n-type silicon region to define a p-n junction space charge region. A copper region formed over the silicon may be connected to both the p-region and n-region by respective contacts, to thereby define a short circuit. Light incident on the p-n junction space charge region, e.g., during a CMP process, creates a current flow through the metal region via the short circuit, which drives chemical reactions that cause corrosion in the copper region. Due to the short circuit configuration, the copper region is highly sensitive to corrosion. The corrosion-sensitive structure may be arranged with less corrosion-sensitive copper structures in the IC device, with the corrosion-sensitive structure used as a proxy to monitor for copper corrosion in the IC device.

One embodiment provides an IC device including a corrosion monitoring system. The corrosion monitoring system may include a p-type active region adjacent an n-type active region to define a p-n junction space charge region; a first conductive contact connected to the p-type active region, and a second conductive contact connected to the n-type active region; and a metal region connected to both the first conductive contact and the second conductive contact, to thereby define a short circuit. Incident light on the p-n junction space charge region creates a current flow through the metal region via the short circuit, which drives chemical reactions that cause corrosion in the metal region.

In one embodiment, the metal region is a copper region, such that the corrosion monitoring system comprises a copper corrosion region. In one embodiment, the IC device includes one or more copper corrosion regions, and a plurality of other copper structures that are less susceptible to corrosion than the copper corrosion region(s).

In some embodiments, the IC device includes, in addition to the corrosion monitoring system, a plurality of non-short circuited integrated circuit structures, each comprising: a p-type active region adjacent an n-type active region to define a p-n junction space charge region; a first conductive contact connected to the p-type active region, and a second conductive contact connected to the n-type active region; and a first metal region coupled to the first conductive contact and a second metal region connected to the second conductive contact and physically discrete from the first metal region; wherein incident light on the p-n junction space charge region of the respective integrated circuit structure creates a current flow through the first and second metal regions, which drives chemical reactions that cause corrosion at respective surfaces of the first and second metal regions; and wherein the corrosion at the respective surfaces of the first and second metal regions of the respective integrated circuit structure is less severe than the corrosion in the metal region of the corrosion monitoring system. One example of a non-short circuited integrated circuit structure is shown in FIG. 2A, discussed above. Thus, in some embodiments an IC device may include any number of functional integrated circuit structures that are susceptible to corrosion but not directly short circuited, and corrosion monitoring system including at least one integrated circuit structure that is short circuited and thus exhibits more severe/faster corrosion, to thereby provide an indication of the corrosion susceptibility of the overall IC device, including the non-short circuited structures.

In one embodiment, the corrosion monitoring system includes at least two n-type active regions and at least two p-type active regions arranged in an alternating manner to define at least two p-n junction space charge regions; and a first conductive contact connected to each p-type active region, and a second conductive contact connected to each n-type active region; wherein the metal region is connected to both the first conductive contacts connected to each p-type active region and the second conductive contacts connected to each n-type active region.

In one embodiment, the corrosion monitoring system includes a second metal region formed in a layer above the metal region and connected to the metal region by at least one conductive contact; wherein incident light on the p-n junction space charge region creates a current flow through the second metal region via a conductive path through the metal region, which drives chemical reactions that cause corrosion in the second metal region.

In one embodiment, the corrosion monitoring system includes (a) a first conductive probe region of the metal region or connected to the metal region at a first location, the first conductive probe region being configured for connection to a current source configured to supply a constant current through the metal region; and (b) a second conductive probe region of the metal region or connected to the metal region at a second location, the second conductive probe region being configured for connection to voltage measurement circuitry for measuring a voltage drop across the metal region.

In one embodiment, the first conductive probe region is connected to the metal region at the first location by a first vertically-extending contact or via, and the second conductive probe region is connected to the metal region at the second location by a second vertically-extending contact or via.

In one embodiment, the corrosion monitoring system includes a first conductive probe region connected to a first area of the metal region by a first vertically-extending contact or via; a second conductive probe region connected to a second area of the metal region by a second vertically-extending contact or via; a current source configured to supply a current from the first conductive probe region to the second conductive probe region via the first vertically-extending contact or via, the metal region, and the second vertically-extending contact or via; and voltage measurement circuitry configured to measure a voltage difference between the first conductive probe region and the second conductive probe region.

Another embodiment provides a system for monitoring corrosion in an integrated circuit device. The system may include a corrosion sensitive structure and a corrosion analysis system. The corrosion sensitive structure may include a p-type active region adjacent an n-type active region to define a p-n junction space charge region; a first conductive contact connected to the p-type active region, and a second conductive contact connected to the n-type active region; and a metal region connected to both the first conductive contact and the second conductive contact, to thereby define a short circuit. Incident light on the p-n junction space charge region creates a current flow through the metal region via the short circuit, which drives chemical reactions that cause corrosion in the metal region. The corrosion analysis system may be configured to analyze corrosion in the metal region of the corrosion sensitive structure.

In one embodiment, the corrosion analysis system includes a laser scattering based inspection system configured to analyze the metal region based on laser scattering.

In another embodiment, the corrosion analysis system includes an automated digital image comparison system configured to compare digital images of the metal region to the die on the left or/and the die on the right.

In another embodiment, the corrosion analysis system includes a current source, separate from the p-n junction space charge region, connected to the metal region and configured to supply a constant current across the metal region; voltage detection circuitry configured to measure a voltage drop across the metal region; and corrosion analysis circuitry configured to calculate a resistance or other measure of corrosion in the metal region based at least on the current supplied by the current source and the measured voltage drop across the metal region.

In one embodiment, the current source and voltage detection circuitry are connected directly to the metal region.

In another embodiment, the current source and voltage detection circuitry are connected to contact regions located in a different metal layer than the metal region and connected to the metal region by vertically-extending conductive contacts.

Another embodiment provides a method for monitoring corrosion in an integrated circuit device. The method includes providing a corrosion monitoring system as disclosed above, and analyzing corrosion in the metal region using an automated corrosion analysis system.

In one embodiment of the method, analyzing corrosion in the metal region includes performing a laser scattering based inspection of the metal region.

In another embodiment of the method, analyzing corrosion in the metal region includes performing an automated analysis of at least one digital image of the metal region.

In another embodiment of the method, analyzing corrosion in the metal region includes delivering a constant current across the metal region, measuring a voltage drop across the metal region, and calculating a measure of corrosion in the metal region based at least on the delivered constant current and the measured voltage drop across the metal region.

In one embodiment of the method, delivering a constant current across the metal region comprise supplying a constant current to a contact region located in a different metal layer than the metal region and connected to the metal region by at least one vertically-extending conductive contact.

BRIEF DESCRIPTION OF THE DRAWINGS

Example aspects and embodiments of the present disclosure are described below in conjunction with the following appended drawings.

DETAILED DESCRIPTION

Figure 1:
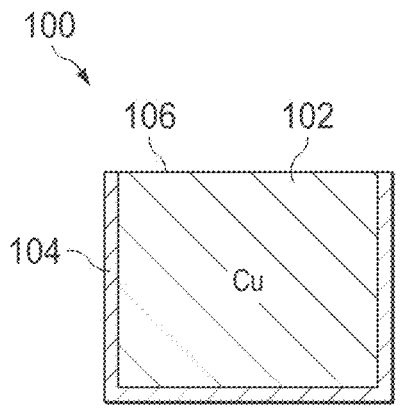
FIG. 1 is a cross-sectional side view of an example of a common copper structure in an integrated circuit device that is susceptible to corrosion.
Figure 2A:
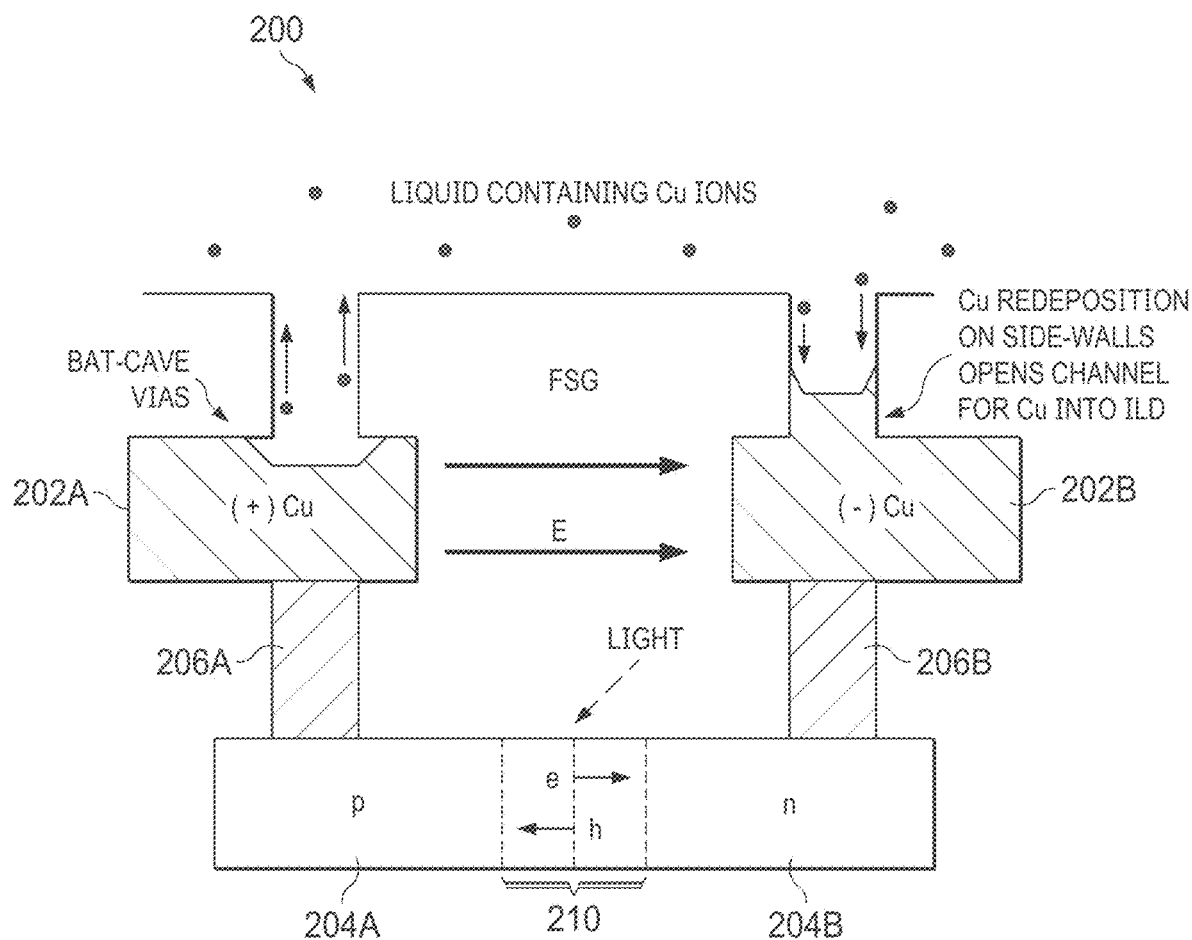
FIGS. 2A and 2B show a cross-sectional side view and a top view, respectively, of another common copper structure in an IC device that is susceptible to corrosion.
Figure 2B:
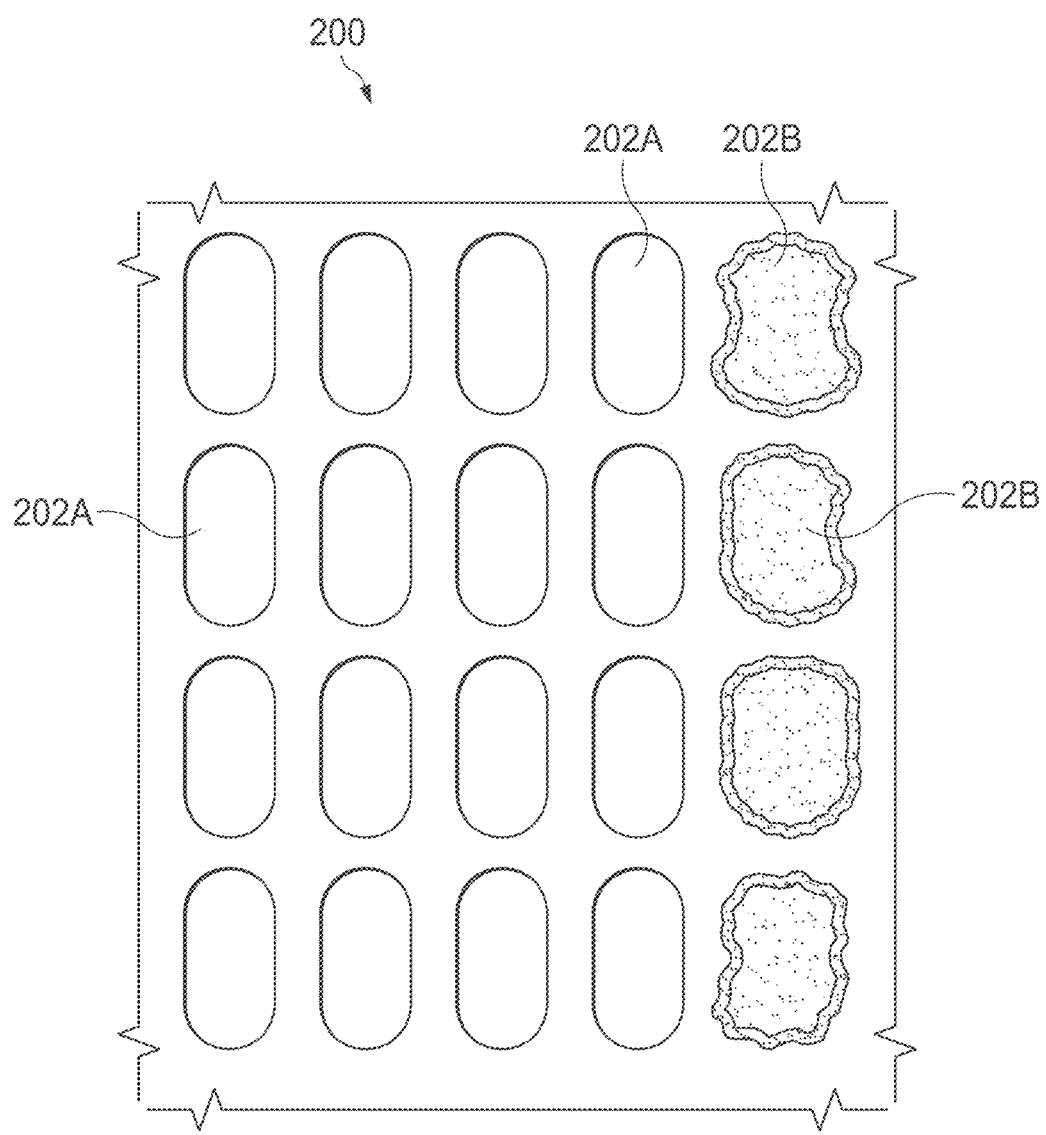
Figure 3:
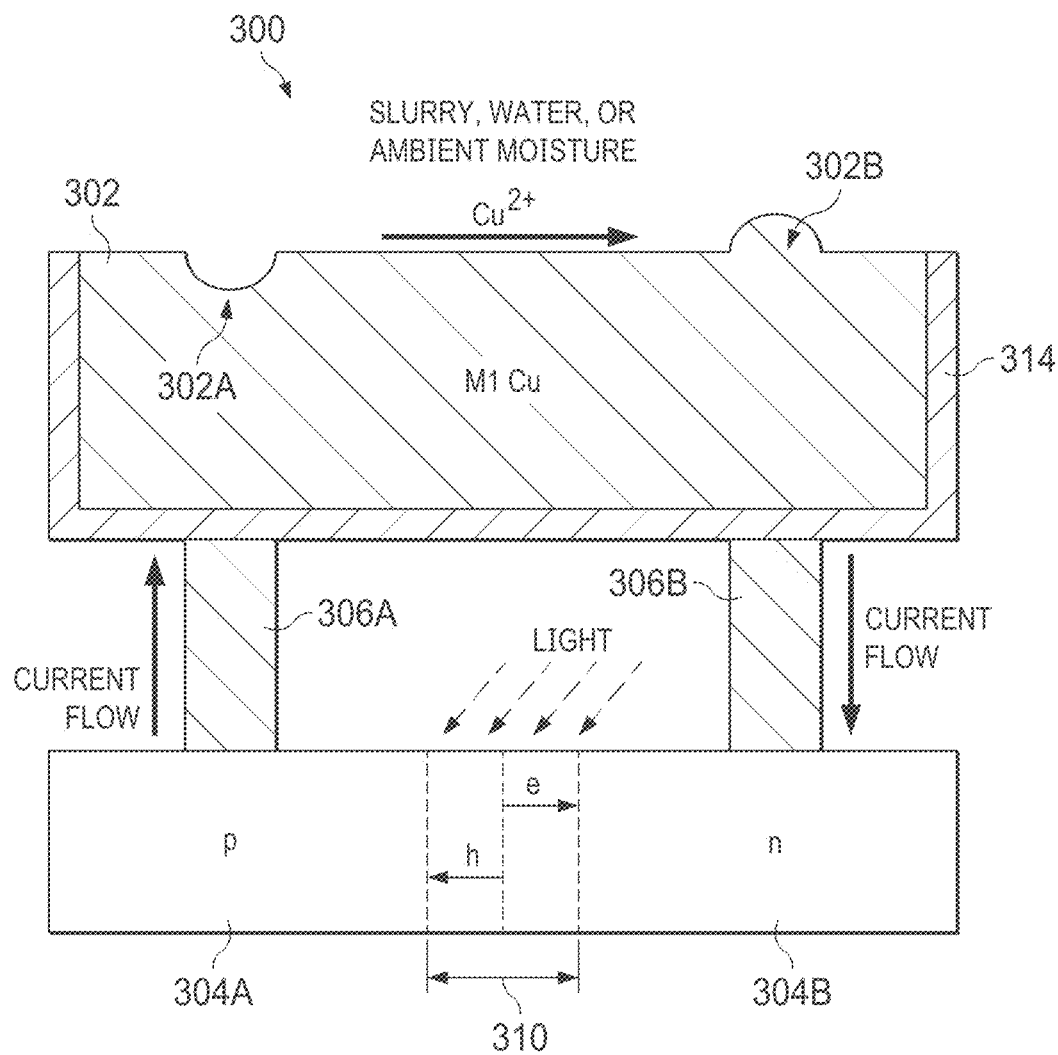
FIG. 3 is a cross-sectional side view of an example copper corrosion monitoring system for monitoring copper corrosion in an integrated circuit device, according to an example embodiment of the present invention.

Embodiments of the present invention provide systems and methods for monitoring copper corrosion in an integrated circuit (IC) device. FIG. 3 is a cross-sectional side view of an example copper corrosion monitoring system 300 for monitoring copper corrosion in an integrated circuit device, according to an example embodiment of the present invention. Copper corrosion monitoring system 300 may include a continuous copper region 302 connected to both a p-doped silicon active region 304A by a first conductive contact 306A and an n-doped silicon active region 304B (adjacent p-region 304A to define a p-n junction "space charge region" 310) by a second conductive contact 306B, to thereby define a conductive short circuit. Thus, corrosion monitoring systems according to embodiments of the present invention may be referred to as short-circuited corrosion monitoring systems. Copper region 302 may be formed over or within a barrier layer 314, e.g., Ta or TaN barrier layer. Contacts 306A and 306B may be formed from any conductive material, e.g., tungsten, cobalt, copper, or aluminum.

Light incident on the space charge region 310 creates electron-hole pairs with electron drift to n-region 304B and hole drift to p-region 304A, which generates a current through the continuous copper region 302. This current causes chemical reactions that result in corrosion of the copper 302. In particular, at the copper surface in the area 302A above the p-region contact 306A, copper is oxidized according to the equation $Cu \rightarrow Cu^{2+} + 2e$. At the same time, at the copper surface in the area 302B above the n-region contact 306B, Cu' is reduced according to the equation $Cu^{2+} + 2e \rightarrow Cu$. This current-based corrosion occurs when copper region 302 is subjected to a slurry or other solution (e.g., during a CMP process), when copper region 302 is subjected to water (e.g., during a CMP clean), and when copper region 302 is subjected to ambient moisture/humidity (e.g., immediately after a CMP process).

The corrosion that occurs in corrosion monitoring system 300 is significantly greater than the corrosion that occurs in other IC structures, such as structures 100 and 200 discussed above, as a result of higher current flow due to the short circuit configuration in corrosion monitoring system 300. Thus, corrosion monitoring system 300 is significantly more susceptible or sensitive to corrosion than other copper-based structures in an IC device.

Based on this enhanced sensitivity to corrosion, corrosion monitoring system 300 may be used for monitoring copper corrosion in an IC device containing other, less corrosion-sensitive copper-based structures. For example, at least one corrosion monitoring system 300 may be formed in an IC device along with other copper-based, functional elements of the IC device (e.g., including structures such as structures 100 and 200, for example). Copper region 302 may be monitored for corrosion, e.g., using known techniques such as laser scattering based inspection or pattern recognition by comparison of digitized images, for example. The enhanced corrosion sensitivity of copper region 302 may allow for more definitive, reliable, and consistent detection of copper corrosion in the IC device, and the copper-based, functional elements of the IC device, which are less corrosion-sensitive than copper region 302, may be assumed to be less corroded than copper region 302. Thus, the detected presence or extent of corrosion in copper region 302 (e.g., using laser scattering based inspection or pattern recognition) may be used as a conservative proxy for copper corrosion within the IC device. In some embodiments, the presence or extent of corrosion in copper region 302 may be compared against one or more defined threshold levels, to classify the IC device with respect to copper corrosion.

Figures 4A, 4B:
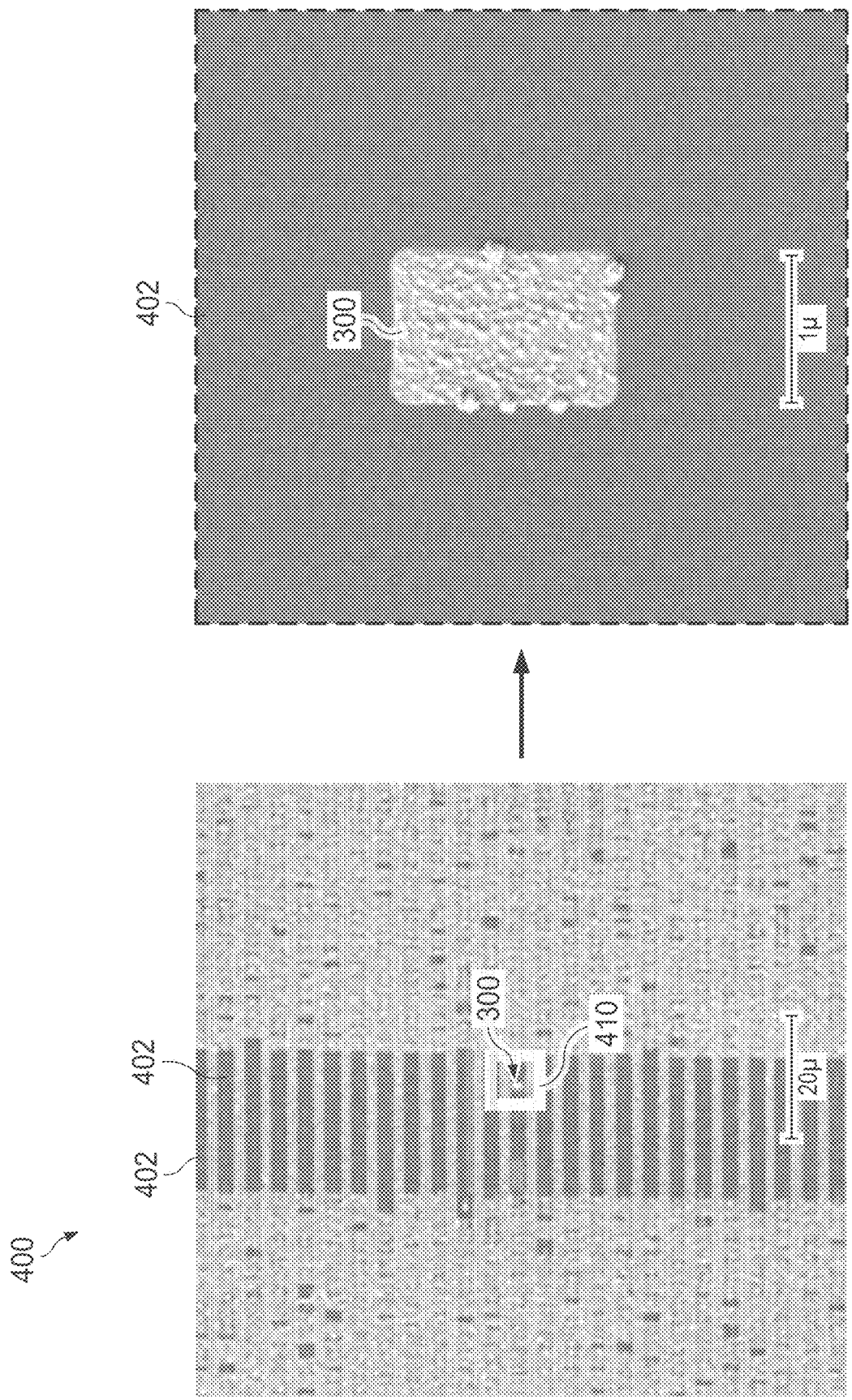
FIG. 4A is an example top view image of an IC device including an array of IC structures including various copper components, and a single corrosion monitoring system in a corroded state, according to an example embodiment.
FIG. 4B is an enlarged image of the corrosion monitoring system shown in FIG. 4A.

FIG. 4A is an example top image of an IC device 400 including an array of non-short circuited IC structures 402 including various copper components, and a single short-circuited corrosion monitoring system 300 in a corroded state, according to an example embodiment. In this image, lighter regions indicate exposed copper surfaces, while darker regions indicate silicon oxide surfaces.

Non-short circuited IC structures 402 may include, for example, structures including a p-type active region adjacent an n-type active region to define a p-n junction space charge region, a first conductive contact connected to the p-type active region, a second conductive contact connected to the n-type active region, and a first metal region coupled to the first conductive contact and a second metal region connected to the second conductive contact but physically discrete from the first metal region. For each non-short circuited IC structure 402, incident light on the p-n junction space charge region may create a current flow through the first and second metal regions, which drives chemical reactions that cause corrosion at respective surfaces of the first and second metal regions, for example reactions occurring through a slurry, liquid, or ambient moisture to which the first and second metal regions are exposed. The corrosion exhibited at the surfaces of the first and second metal regions of the respective non-short circuited IC structure 402 is typically less severe than the corrosion in the metal (e.g., copper) region of the short-circuited corrosion monitoring system 302.

In other embodiments, an IC device may include any number and combination of non-short circuited IC structures and short-circuited corrosion monitoring system(s), e.g., including one or more corrosion monitoring system 300, 500, 600, 700, 800, and/or 900 as disclosed herein.

As shown, corrosion monitoring system 300 exhibits the only copper surface in the field of view where corrosion is observed due to its enhanced sensitivity to corrosion. FIG. 4B is an enlarged image of region 410 shown in FIG. 4A, showing the corroded upper copper surface of corrosion monitoring system 300 (in the corroded state), surrounded by silicon oxide of IC device 400. As shown, the corrosion monitoring system 300 in the corroded state is visibly distinguished from the surrounding (non-short circuited) structures, and can be distinctly identified by known detection techniques (e.g., laser scattering based inspection or digital image pattern recognition).

The corrosion sensitivity/susceptibility of a corrosion monitoring system according to the present invention may be depend in part on the ratio of the area of the p-n junction space charge region (from a top view) to the area of the continuous copper region that is susceptible to corrosion (again from a top view), which may be referred to an the "antenna ratio" of the corrosion monitoring system, where:

$$\text{Antenna Ratio} = \frac{p-n \text{ junction space charge region area (cause)}}{\text{copper corrosion area (effect)}} \quad (1)$$

The corrosion current passing through the copper region (e.g., caused by light incident on the p-n junction), and thus the resulting corrosion in the copper region, is proportional to the antenna ratio. Thus, the corrosion sensitivity of each corrosion monitoring system according to the present invention may be selected, or "tuned," by providing a desired antenna ratio. This concept is illustrated in FIGS. 5 and 6, for example.

Figure 5:
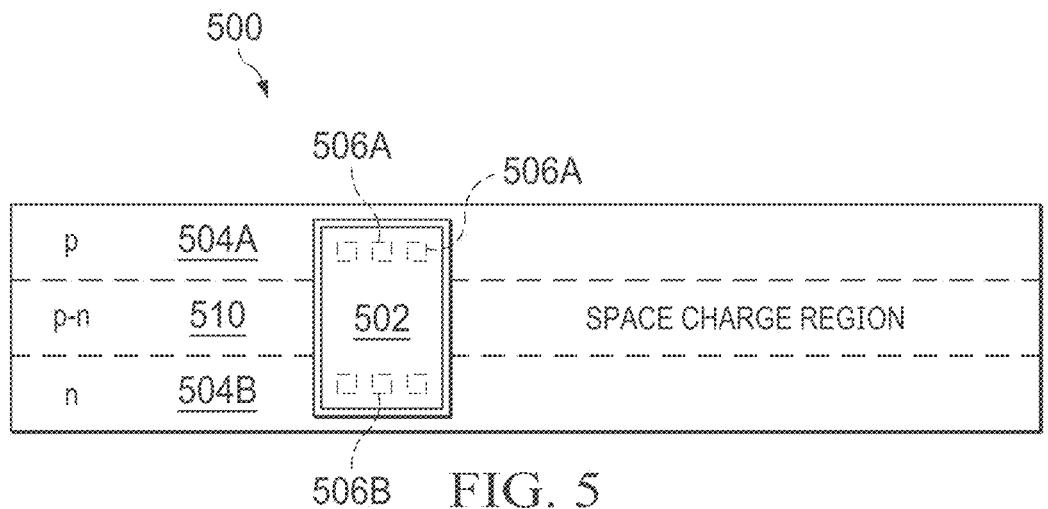
FIG. 5 shows a top view of an example corrosion monitoring system, including a copper corrosion region extending over a single p-n junction space charge region, according to one example embodiment of the invention.

FIG. 5 shows a top view of an example corrosion monitoring system 500, generally similar in configuration to corrosion monitoring system 300 shown in FIG. 3, according to one example embodiment of the invention. Corrosion monitoring system 500 includes a continuous copper corrosion region 502 (e.g., metal layer 1) formed over a single p-n junction space charge region 510 defined between a single p-region 504A and n-region 504B, and connected to p-region 504A and n-region 504B by a number (any suitable number) of conductive contacts 506A and 506B (e.g., formed from tungsten or cobalt). According to Equation (1), the antenna ratio of example corrosion monitoring system 500 is equal to the top view area of p-n junction space charge region 510 divided by the top view area of copper corrosion region 502.

Figure 6:
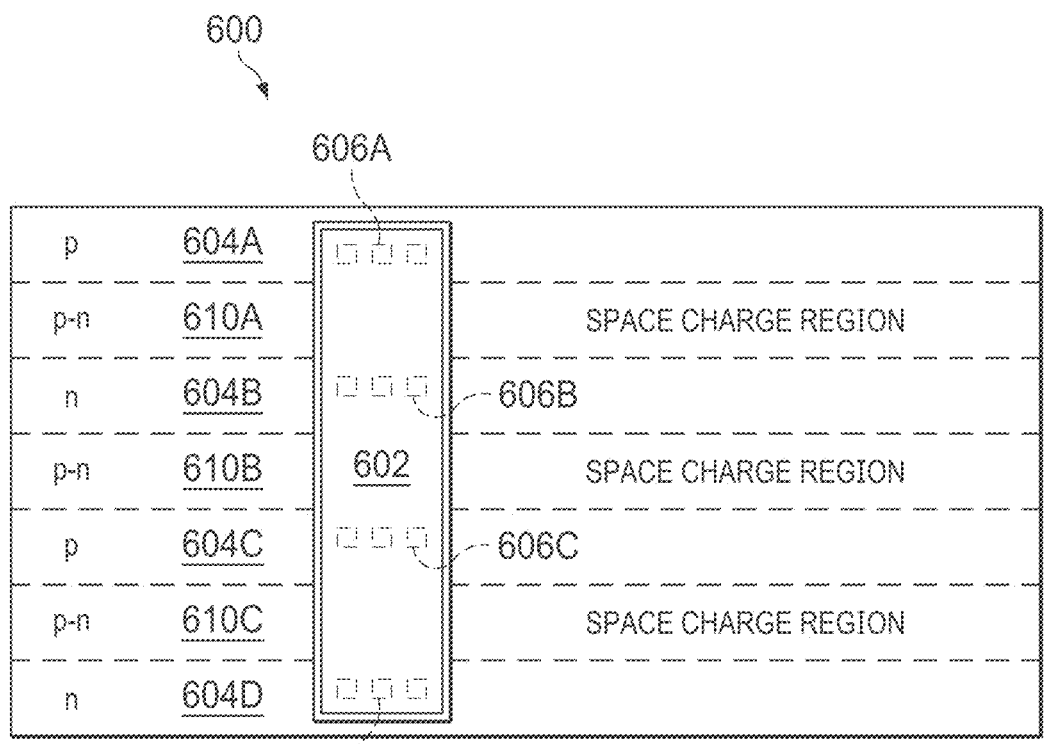
FIG. 6 shows a top view of another example corrosion monitoring system, including a copper corrosion region extending over multiple p-n junction space charge regions, according to one example embodiment of the invention.

FIG. 6 shows a top view of another example corrosion monitoring system 600, according to another example embodiment of the invention. Unlike corrosion monitoring system 500, corrosion monitoring system 600 includes a continuous copper corrosion region 602 (e.g., metal layer 1) extending over multiple p-n junction space charge regions 610 defined between adjacent pairs of p-regions and n-regions 604. In this example, a first p-n junction space charge region 610A is defined between p-region 604A and n-region 604B; a second p-n junction space charge region 610B is defined between n-region 604B and p-region 604C; and a third p-n junction space charge region 610C is defined between p-region 604C and n-region 604D. Copper corrosion region 602 may be connected to each p-region/n-region 604A-D by any suitable number of conductive contacts 606A, 606B, 606C and 606D, respectively (e.g., formed from tungsten or cobalt).

According to Equation (1), the antenna ratio of example corrosion monitoring system 600 is equal to the total combined area of p-n junction space charge regions 610A, 610B, and 610C divided by the top view area of copper corrosion region 602, which provides a higher antenna ratio (all other things held equal) than the antenna ratio of corrosion monitoring system 500 having only a single p-n junction. Thus, one technique for tuning the antenna ratio of a corrosion monitoring system according to the present invention is to increase or decrease the number (and respective areas) of p-n junction space charge regions connected to the overlying copper corrosion region. In addition, a structure with great sensitivity to corrosion can be created within a limited space in the IC device, e.g., within the space of a scribe line for example.

In addition, in some embodiments of the invention, the corrosion monitoring system may extend across multiple metal layers in an IC device structure, e.g., to monitor for corrosion at each metal layer as the IC stack is built up, and/or to simultaneously monitor corrosion at multiple metal layers that have been formed.

Figure 7:
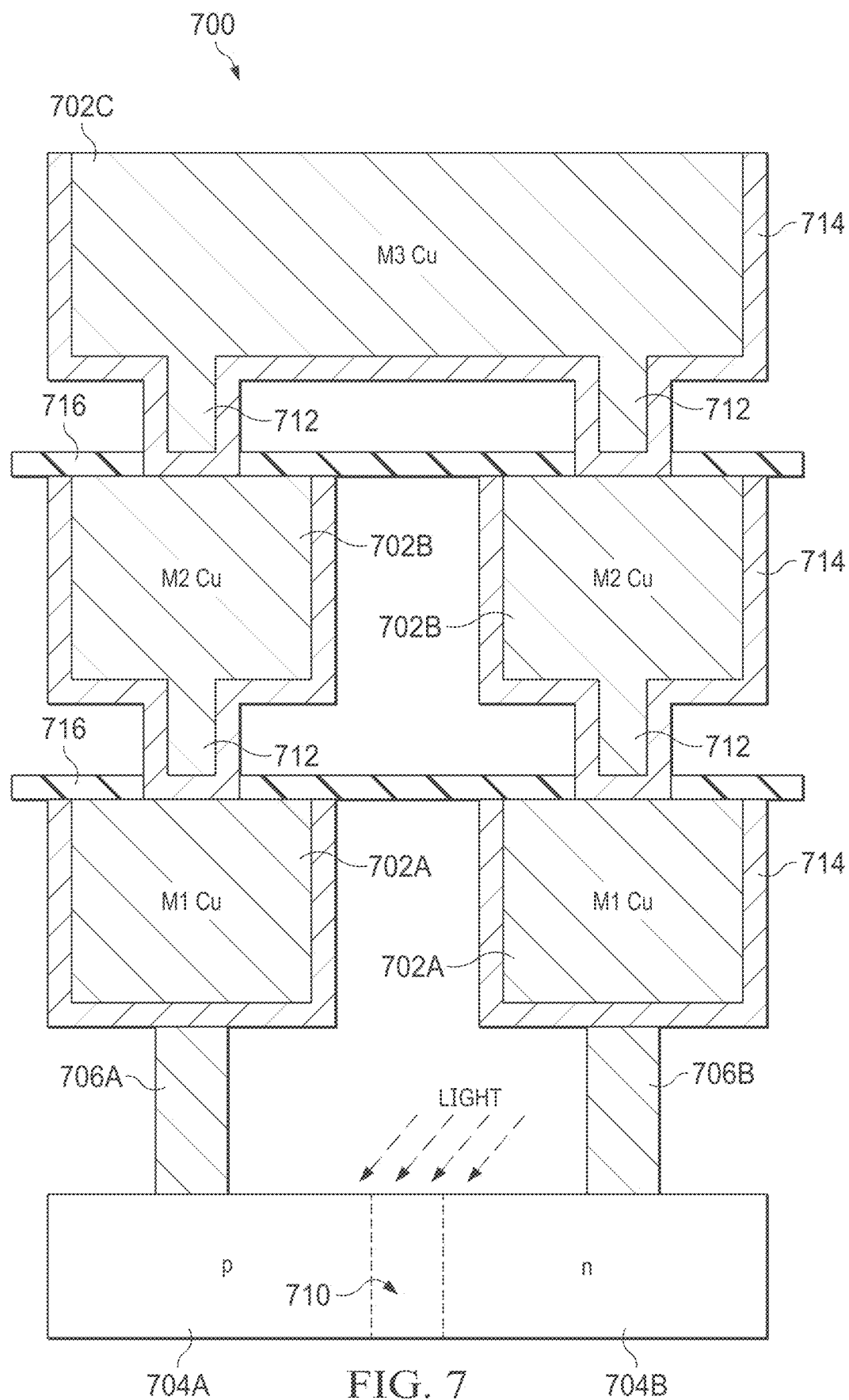
FIG. 7 is a cross-sectional side view of an example multi-level corrosion monitoring system, according to one example embodiment of the invention.

FIG. 7 is a cross-sectional side view of an example multi-level corrosion monitoring system 700, according to one example embodiment of the invention. In this example, multi-level corrosion monitoring system 700 includes a continuous metal layer 3 (M3) corrosion structure 702C used to detect corrosion at the M3 level. Structure 702C may be conductively connected, through metal layer 2 (M2) and metal layer 1 (M1), to an underlying silicon region including a p-type active region 704A and n-type active region 704B that define a p-n junction space charge region 710, to thereby define a define a short circuit through M3 level corrosion structure 702C.

In the example shown in FIG. 7, corrosion monitoring system 700 includes a pair of M1 copper regions 702A, a pair of M2 copper regions 702B, and the M3 copper corrosion region 702C. Copper regions 702A, 702B, and 702C may be conductively connected to each other, and to the underlying silicon (704A, 704B) by any suitable structures. In the illustrated example, M1 copper regions 702A may be connected to p-region 704A and n-region 704B by a number (any suitable number and type(s)) of conductive contacts 706A and 706B (e.g., formed from tungsten or cobalt), and copper regions 702A, 702B, and 702C may be connected to each other by copper vias or contacts 712, for example. In the illustrated embodiment, each copper region 702A, 702B, and 702C has a corresponding surrounding barrier layer 714, e.g., formed from Ta or TaN.

In the illustrated example, the M3 corrosion region 702C is (a) conductively connected at a first side or location to p-region 704A through a respective M2 copper region 702B, a respective M1 copper region 702A, respective vias or contacts 712, and a respective p-region contact 706A, and (b) conductively connected at a second side or location to n-region 704B through a respective M2 copper region 702B, a respective M1 copper region 702A, respective vias or contacts 712, and a respective n-region contact 706B. This configuration defines a short circuit extending through p-n junction space charge region 710 and though M3 corrosion region 702C, to thereby define a device for monitoring corrosion in the M3 layer.

It should be understood that while example corrosion monitoring system 700 is configured for monitoring corrosion at the M3 level (and thus extends through the M2 and M1 levels), multi-level corrosion monitoring systems may be constructed according to the present teachings for monitoring copper corrosion at any selected level in the IC stack (e.g., M1, M2, M3, M4, etc.). In addition, a multi-level corrosion structure may be connected to an array of multiple p-regions/n-regions that define any number of p-n junction space charge regions, e.g., according to the concepts shown in FIG. 6 discussed above.

Figure 8:
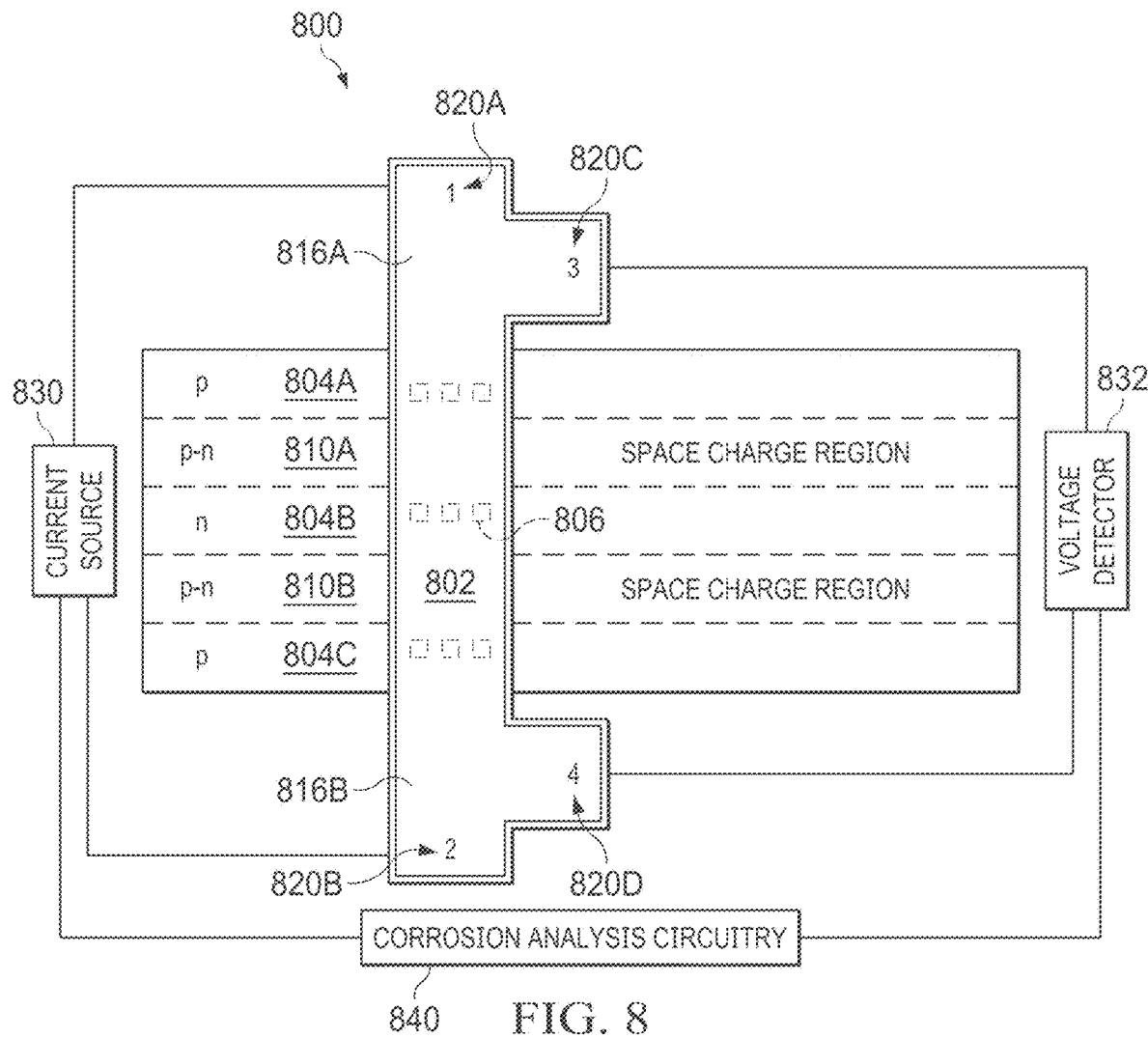
FIG. 8 illustrates a top view of an example corrosion monitoring system including a corrosion-sensitive copper region and circuitry for performing electrical testing for detecting corrosion in the copper region, according to one example embodiment of the invention.
Figure 9A:
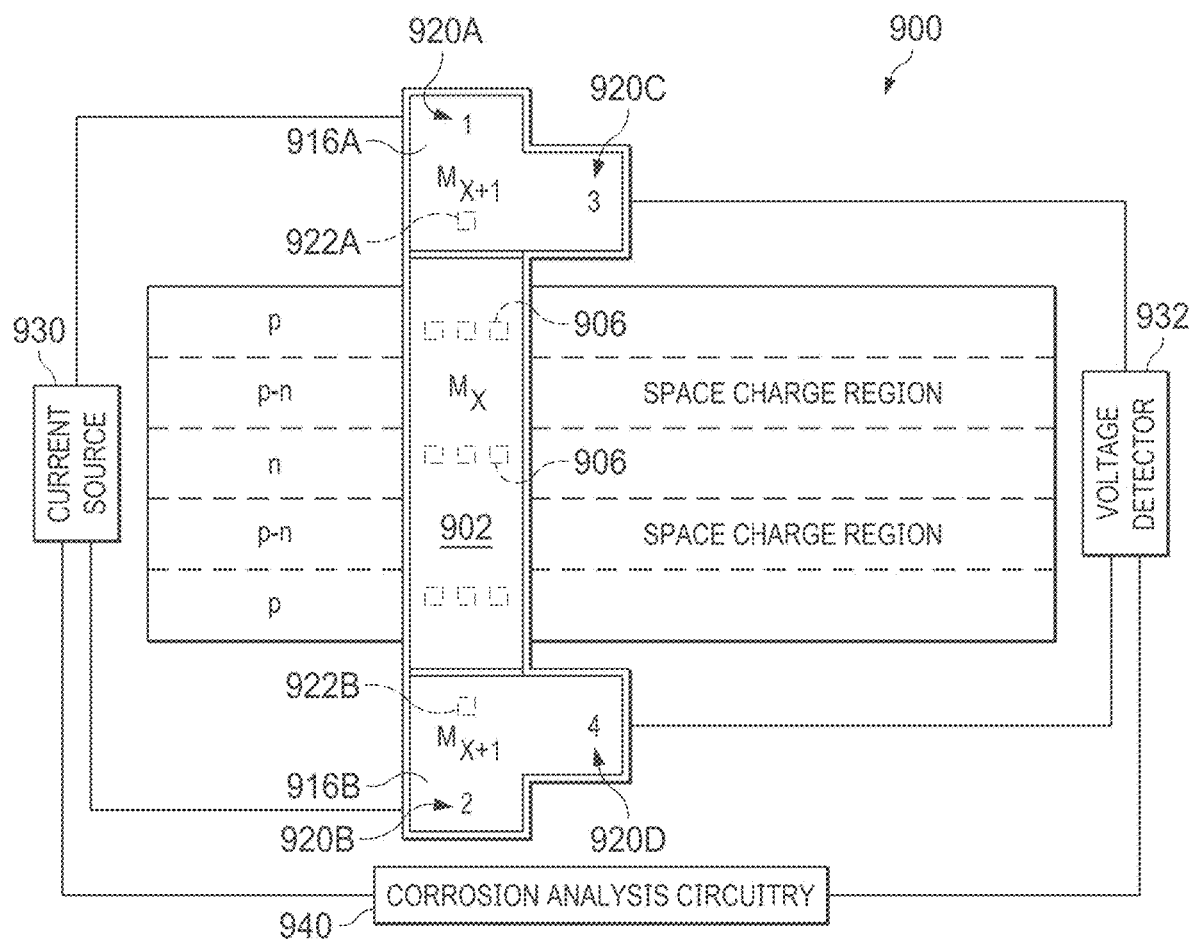
FIGS. 9A and 9B show a top view and a cross-sectional side view of an example corrosion monitoring system including a corrosion-sensitive copper region and circuitry for performing electrical testing for detecting corrosion in the copper region, wherein the testing circuitry is connected to probe regions located in a different metal layer than the corrosion-sensitive copper region, according to one example embodiment of the invention.
Figure 9B:
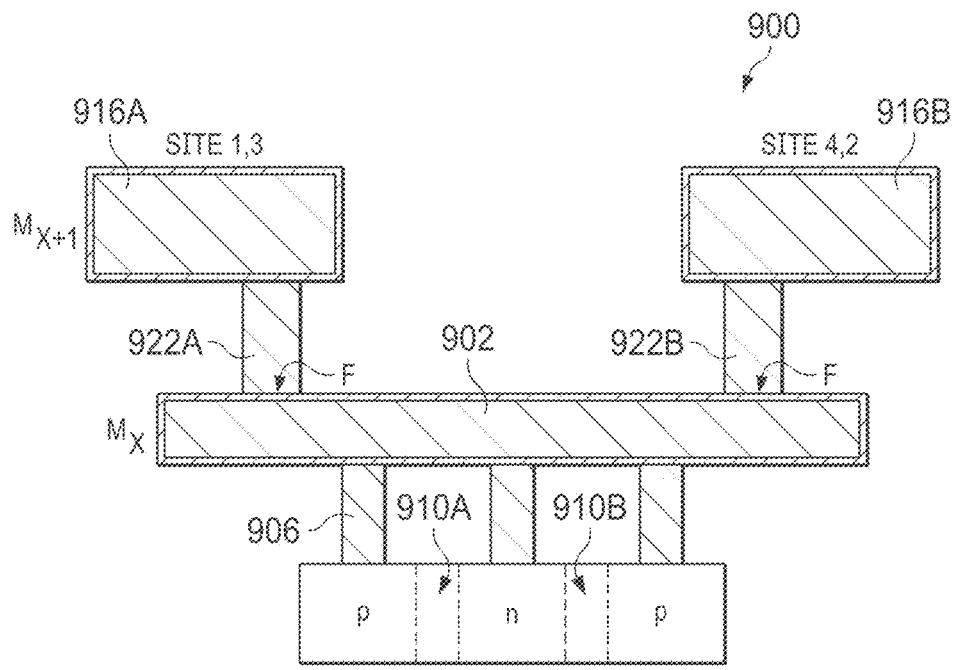

In addition, in some embodiments, the corrosion monitoring system may be configured for electric measurement of copper corrosion by using test instruments to apply a current through the corrosion-sensitive copper region and measure at least one electric property associated with the level of copper corrosion (e.g., voltage drop across the copper region, or resistance, without limitation), and using suitable corrosion analysis circuitry to calculate a measure of corrosion in the copper region based at least on the current supplied by the current source and the measured electric property. FIGS. 8 and 9A-9B illustrate two example embodiments of such corrosion monitoring systems with the associated circuitry to form a corrosion monitoring system.

FIG. 8 illustrates a top view of an example corrosion monitoring system 800 including a corrosion-sensitive copper region 802 (e.g., M1) extending over multiple p-n junction space charge regions 810 defined between adjacent pairs of p-regions and n-regions 804, and connected to p-regions and n-regions 804 by conductive contacts 806. In this example, a first p-n junction space charge region 810A is defined between p-region 804A and n-region 804B; and a second p-n junction space charge region 810B is defined between n-region 804B and p-region 804C. Copper corrosion region 802 may include, or be conductively coupled to, a pair of probe connection pads or regions 816A and 816B at opposing ends of copper corrosion region 802.

Probe connection pads 816A and 816B may include or define probe connection sites for a four-point probe to test electromigration (corrosion) in copper corrosion region 802, e.g., according to the van der Pauw method.

Thus, corrosion monitoring system 800 may include test instruments and evaluation circuitry for determining a measure of corrosion in the copper corrosion region 802, e.g., a constant current source, a detector for detecting voltage drop, resistance, or other electrical property associated with the copper, and corrosion analysis circuitry 840 for calculating a measure of copper corrosion based at least on the detected electrical property.

In this example, probe connection pads 816A and 816B may include probe connection sites 820A and 820B (indicated at "1" and "2" in FIG. 8) for connection to a current source 830 to pass a controllable current through copper corrosion region 802. Probe connection regions 816A and 816B may also include probe connection sites 820C and 820D (indicated at "3" and "4" in FIG. 8) for connection to a voltage detector/voltage detection circuitry 832, to measure the voltage drop across copper corrosion region 802. Suitable corrosion analysis circuitry 840 may then calculate a resistance of the copper corrosion region 802 based the current passed through copper corrosion region 802 and the measured voltage drop, which resistance may represent a level of electromigration/corrosion in the copper corrosion region 802. In other embodiments, the corrosion analysis circuitry 840 may use the current through copper corrosion region 802 and the measured voltage drop to calculate any other electrical property that may represent an extent of corrosion in the copper corrosion region 802.

FIGS. 9A-9B illustrates a top view (FIG. 9A) and a cross-sectional side view (FIG. 9B) of another example corrosion monitoring system 900 including a corrosion-sensitive copper region 902 (e.g., M1) extending over p-n junction space charge regions 910A and 910B defined between adjacent pairs of p-regions and n-regions, and connected to the p-regions and n-regions by conductive contacts 906, similar to the structure of corrosion monitoring system 800. However, unlike corrosion monitoring system 800, corrosion monitoring system 900 includes probe connection pads or regions 916A and 916B located in a different IC stack layer, e.g., a different metal layer, than the corrosion-sensitive copper region 902 (e.g., a higher or lower metal layer). Probe connection pads or regions 916A and 916B may be conductively coupled to copper region 902 by any suitable conductive contacts 922A and 922B, e.g., vias or interconnects.

Probe connection pads or regions 916A and 916B may include probe connection sites 920A and 920B (indicated at "1" and "2" in FIG. 9) for connection to a current source 930, to pass a controllable current through copper corrosion region 902 (through contacts 922A, 922B). Probe connection regions 916A and 916B may also include probe connection sites 920C and 920D (indicated at "3" and "4" in FIG. 9) for connection to a voltage detector/voltage detection circuitry 932, to measure the voltage drop across copper corrosion region 902. Suitable corrosion analysis circuitry 940 may then calculate a resistance of the copper corrosion region 902 based the current passed through copper corrosion region 902 and the measured voltage drop, which resistance may represent a level of electromigration/corrosion in the copper corrosion region 902. In other embodiments, the corrosion analysis circuitry 940 may use the current through copper corrosion region 902 and the measured voltage drop to calculate any other electrical property that may represent an extent of corrosion in the copper corrosion region 902.

In a configuration such as shown in FIGS. 9A-9B including multiple metal layers connected by via or other contacts, a common failure location is at the interface between the top surface of copper 902 and bottom surfaces of contacts 922A, 922B, indicated in FIG. 9B at "F." For example, in a structure including damascene copper interconnects, the via may be particularly susceptible to electromigration, especially when connected with a corroded metal surface underneath, e.g., at locations "F" shown in FIG. 9B. Thus, providing probe connection regions 916A and 916B connected to contacts 922A and 922B may provide an indication of overall corrosion of the respective device.

The present disclosure focuses on copper corrosion. However, it should be understood that the invention may be similarly utilized for monitoring corrosion of other suitable metals or materials, such as other metals that do not form an effective native oxide for preventing oxygen penetration, for example.

The invention claimed is:

1. A method for monitoring corrosion, method comprising:
    providing an integrated circuit device including a corrosion monitoring system comprising:
        a p-type active region adjacent an n-type active region to define a p-n junction space charge region;
        a first conductive contact connected to the p-type active region, and a second conductive contact connected to the n-type active region; and
        a metal region connected to both the first conductive contact and the second conductive contact, to thereby define a short circuit;
        wherein incident light on the p-n junction space charge region creates a current flow through the metal region via the short circuit, which drives chemical reactions that cause corrosion in the metal region; and
    performing an automated corrosion analysis of corrosion in the metal region of the corrosion monitoring system by a process including:
        measuring a voltage drop across the metal region; and
        calculating a resistance or other measure of corrosion in the metal region based at least on the measured voltage drop across the metal region.

2. The method of claim 1, wherein performing the automated corrosion analysis of corrosion in the metal region comprises:
    applying a current across the metal region;
    measuring the voltage drop across the metal region; and
    calculating the resistance or other measure of corrosion in the metal region based at least on the applied current and the measured voltage drop across the metal region.

3. The method of claim 2, wherein applying a current across the metal region comprise supplying a constant current to a contact region located in a different metal layer than the metal region and connected to the metal region by at least one vertically-extending conductive contact.

4. The method of claim 2, comprising:
    applying the current across the metal region by a current source connected directly to the metal region; and
    measuring the voltage drop across the metal region by voltage detection circuitry connected directly to the metal region.

5. The method of claim 2, comprising:
    applying the current across the metal region by a current source connected to a first contact region located in a further metal layer different than the metal region and connected to the metal region by a first vertically-extending conductive contact; and
    measuring the voltage drop across the metal region by voltage detection circuitry connected to a second contact region located in the further metal layer and connected to the metal region by a second vertically-extending conductive contact.

6. The method of claim 2, comprising:
    applying the current from a current source to a first conductive probe region comprising a region of the metal region or connected to the metal region at a first location; and
    measuring the voltage drop across the metal region by voltage measurement circuitry connected to a second conductive probe region of the metal region or connected to the metal region at a second location.

7. The method of claim 1, wherein the metal region comprises a copper region.

8. The method of claim 1, wherein the first conductive contact is directly connected to the p-type active region, and the second conductive contact is directly connected to the n-type active region.

9. The method of claim 1, wherein:
    the metal region of the corrosion monitoring system is a copper region; and
    the integrated circuit device includes a plurality of other copper structures;
    wherein the copper region of the corrosion monitoring systems is more susceptible to corrosion than the other copper structures.

10. The method of claim 1, the corrosion monitoring system including:
    at least two p-type active regions and at least two p-type active regions arranged in an alternating manner to define at least two p-n junction space charge regions; and
    a first conductive contact connected to each p-type active region, and a second conductive contact connected to each n-type active region;
    wherein the metal region is connected to both the first conductive contacts connected to each p-type active region and the second conductive contacts connected to each n-type active region.

11. A method for monitoring corrosion, method comprising:
    providing an integrated circuit device including:
        (a) a plurality of integrated circuit (IC) structures, each IC structure comprising:
            an IC structure p-type active region adjacent an IC structure n-type active region to define an IC structure p-n junction space charge region;
            a first IC structure conductive contact connected to the IC structure p-type active region, and a second IC structure conductive contact connected to the IC structure n-type active region; and
            a first IC structure metal region coupled to the first IC structure conductive contact and a second IC structure metal region connected to the second IC structure conductive contact and physically discrete from the first IC structure metal region;
            wherein incident light on the IC structure p-n junction space charge region of the respective IC structure creates a current flow through the first and second IC structure metal regions, which drives chemical reactions that cause corrosion at respective surfaces of the first and second IC structure metal regions; and (b) a corrosion monitoring system comprising:
a p-type active region adjacent an n-type active region to define a p-n junction space charge region;
a first conductive contact connected to the p-type active region, and a second conductive contact connected to the n-type active region; and
a metal region connected to both the first conductive contact and the second conductive contact, to thereby define a short circuit;
wherein incident light on the p-n junction space charge region creates a current flow through the metal region via the short circuit, which drives chemical reactions that cause corrosion in the metal region; and
wherein the corrosion in the metal region of the corrosion monitoring system is more severe than the corrosion at the respective surfaces of the first and second IC structure metal regions of the respective IC structures; and performing an automated corrosion analysis of corrosion in the metal region of the corrosion monitoring system.

12. A method for monitoring corrosion, comprising:
providing an integrated circuit device including:
(a) a short-circuited corrosion monitoring system comprising:
a first p-type active region adjacent a first n-type active region to define a first p-n junction space charge region; and
a metal region conductively coupled to the first p-type active region and first n-type active region to define a short circuit across the first p-n junction space charge region;
wherein incident light on the p-n junction space charge region creates a current flow through the metal region via the short circuit that causes corrosion in the metal region; and
(b) a non-short-circuited IC structure comprising:
a second p-type active region adjacent a second n-type active region to define a second p-n junction space charge region; and
a first metal contact coupled to the second p-type active region and a second metal contact coupled to the second n-type active region and physically discrete from the first metal contact;
wherein incident light on the p-n junction space charge region creates a current flow through the first metal contact and the second metal contact that drives chemical reactions that cause corrosion at respective surfaces of the first and second metal contacts;
wherein the corrosion at the respective surfaces of the first and second metal contacts of the non-short-circuited IC structure is less severe than the corrosion in the metal region of the short-circuited corrosion monitoring system; and performing an automated corrosion analysis of corrosion in the metal region of the short-circuited corrosion monitoring system.

13. The method of claim 12, wherein performing an automated corrosion analysis of corrosion in the metal region of the short-circuited corrosion monitoring system comprises:
applying a current across the metal region of the short-circuited corrosion monitoring system;
measuring a voltage drop across the metal region of the short-circuited corrosion monitoring system; and
calculating a resistance or other measure of corrosion in the metal region of the short-circuited corrosion monitoring system based at least on the applied current and the measured voltage drop.

14. The method of claim 12, wherein performing an automated corrosion analysis of corrosion in the metal region comprises:
measuring a voltage drop across the metal region of the short-circuited corrosion monitoring system; and
calculating a resistance or other measure of corrosion in the metal region of the short-circuited corrosion monitoring system based at least on the measured voltage drop.

15. The method of claim 12, wherein performing an automated corrosion analysis of corrosion in the metal region of the short-circuited corrosion monitoring system comprises performing a laser scattering based inspection of the metal region of the short-circuited corrosion monitoring system.

16. The method of claim 12, wherein performing an automated corrosion analysis of corrosion in the metal region of the short-circuited corrosion monitoring system comprises performing an automated analysis of at least one digital image of the metal region of the short-circuited corrosion monitoring system.

17. The method of claim 12, wherein the metal region of the short-circuited corrosion monitoring system comprises a copper region.

* * * * *